Figure 1A:
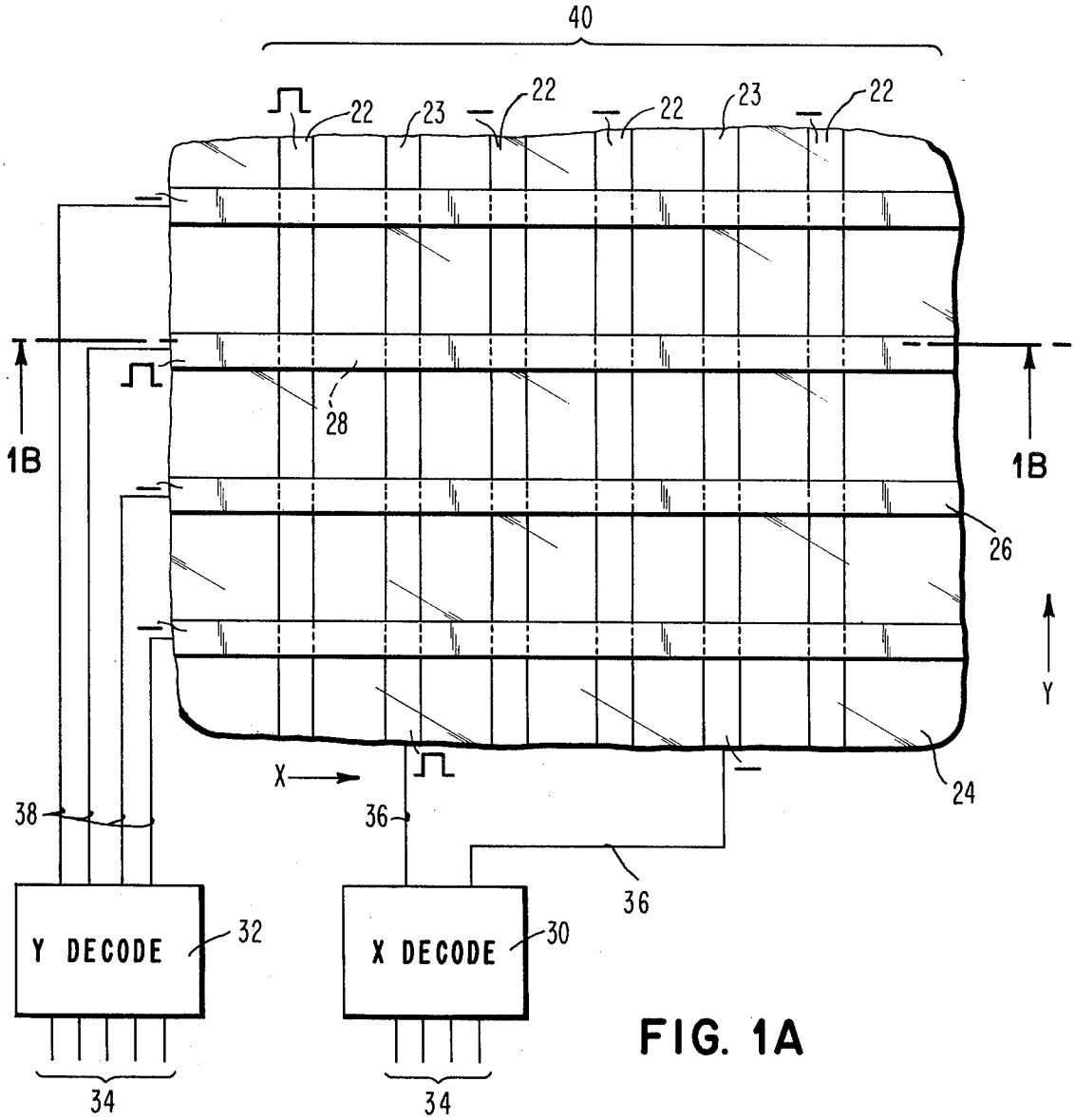
Figure 1B:
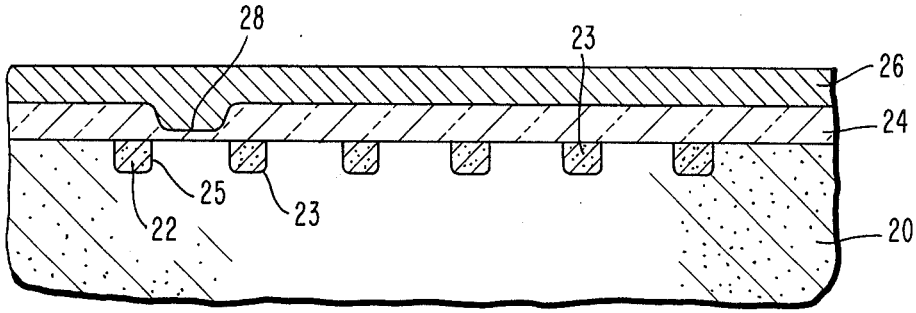
Figure 2:
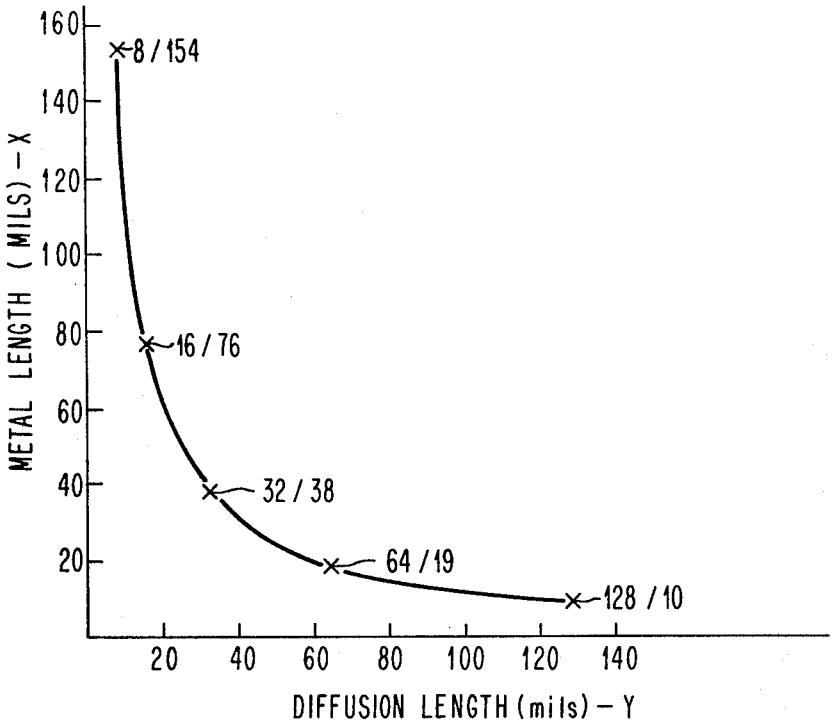
Figure 3:
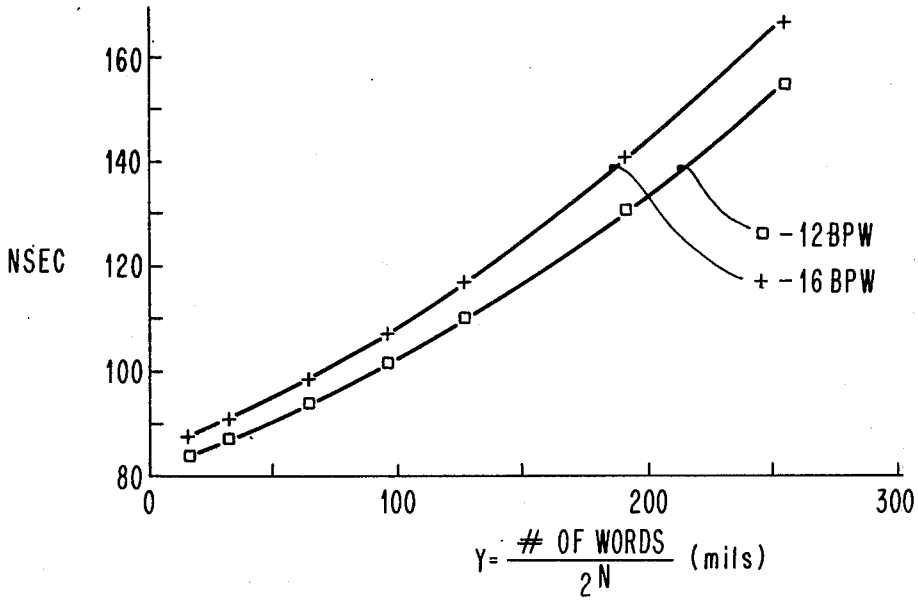

United States Defensive Publication [19] (H) [11] T977,006

Balasubramanian et al. [43] Dec. 5, 1978

[54] READ ONLY MEMORY WITH OPTIMIZED DIMENSION FOR IMPROVED PERFORMANCE AND CHIP AREA UTILIZATION

[75] Inventors: Peruvemba S. Balasubramanian; Edwin C. Grazier; John D. Henke; Robert P. Latham; Martin J. Myers, all of Manassas, Va.

[73] Assignee: International Business Machines Corporation, Armonk, N.Y.

[21] Appl. No.: 899,615

[22] Filed: Apr. 24, 1978

Related U.S. Application Data

[63] Continuation of Ser. No. 747,140, Dec. 3, 1976, abandoned.

[51] Int. Cl.[2] ..... G11C 17/00

[52] U.S. Cl. ..... 357/45; 357/41; 365/104; 365/150

[57] ABSTRACT

A read only memory on a semiconductor substrate having metal word lines and diffused bit lines with optimized dimensions for a selected performance and storage capacity with the metal lines being along an X dimension and the diffused lines being orthogonally related to the metal lines along a Y dimension. The $X$ dimension for the substrate is given by the relation $X = 2^N \cdot WL \cdot K1$ where $2^N$ is an integer definitive of the number of words on a metal line where N is any integer power greater than zero; WL is word length which equals the number of storage devices per word selected for a word and K1 is a constant definitive of the average spacing in mils between the storage devices along the first length, and the Y dimension being given by a second relation $Y = K2 \cdot Q/2^N$ where K2 is a constant definitive of the spacing in mils between the adjacent rows of storage devices along the second length and Q is the number of said words. Changing the aspect ratio for an array permits the performance of a read only memory to be changed to a different set of X and Y dimensions.

10 Claims, 2 Sheets Drawing,

16 Pages Specification

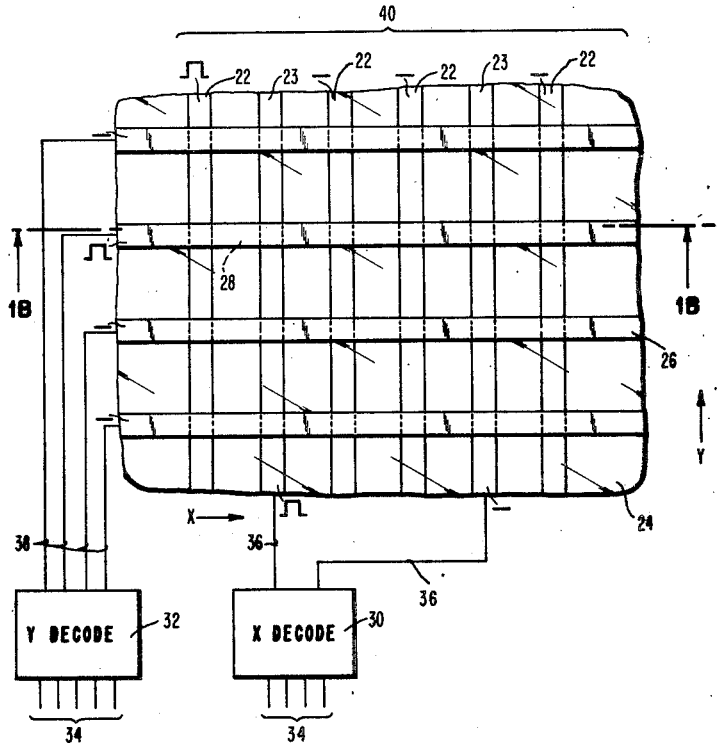

The file of this unexamined application may be inspected and copies thereof may be purchased (849 O.G. 1221, Apr. 9, 1968).